United States Patent
Kobayashi

(10) Patent No.: US 7,508,035 B2
(45) Date of Patent: Mar. 24, 2009

(54) SEMICONDUCTOR DEVICE AND DRIVING METHOD OF SEMICONDUCTOR DEVICE

(75) Inventor: Masanao Kobayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 269 days.

(21) Appl. No.: 11/204,071

(22) Filed: Aug. 15, 2005

(65) Prior Publication Data
US 2006/0040431 A1 Feb. 23, 2006

(30) Foreign Application Priority Data
Aug. 19, 2004 (JP) ............... 2004-239090

(51) Int. Cl.
H01L 21/84 (2006.01)
(52) U.S. Cl. .............. 257/347; 257/E21.561; 438/151
(58) Field of Classification Search ......... 257/347–354, 257/E21.561; 438/151–166
See application file for complete search history.

(56) References Cited

U.S. PATENT DOCUMENTS

| 4,922,371 A | * | 5/1990 | Gray et al. ............... 361/56 |
| 5,414,276 A | * | 5/1995 | McCarthy .................... 257/57 |
| 7,238,591 B1 | * | 7/2007 | Lin ............................ 438/459 |
| 2003/0170936 A1 | * | 9/2003 | Christensen et al. ........ 438/151 |

FOREIGN PATENT DOCUMENTS

| JP | 5-85777 | 4/1993 |
| JP | 5291251 A | 11/1993 |
| JP | 6-204212 | 7/1994 |
| JP | 7-159809 | 6/1995 |
| JP | 9-107108 | 4/1997 |
| JP | 2000-183352 | 6/2000 |

* cited by examiner

Primary Examiner—Richard A. Booth
(74) Attorney, Agent, or Firm—Rosalio Haro

(57) ABSTRACT

A support member for semiconductor device elements includes a conductive layer separated from the semiconductor elements by an insulative layer. A protective potential lower than any operating potential applied to the semiconductor device elements is applied to the conductive layer. The relatively negative potential on the conductive layer forms an electric field for gettering mobile ions from layers of the support member both above and below the conductive layer. Additionally, the conductive layer within the support member serves as a second plate in construction of capacitors and as a wiring layer for use with the semiconductor device elements. Also, due to the reflective properties of the conductive layer, it may function as a light shield or reflector in the construction of optic devices.

28 Claims, 4 Drawing Sheets

101 ... SILICATE GLASS AS BASE
102 ... SILICON OXIDE FILM AS FIRST DIELECTRIC
103 ... TUNGSTEN FILM AS CONDUCTIVE FILM
104 SILICOIN OXIDE FILM AS SECOND DIELECTRIC
201 ... POLYCRYSTAL SILICON FILM
302 ... MOS TRANSISTOR
303 ... RETENTION CAPACITANCE
402 ... SOURCE/DRAIN REGION
403 ... ELECTRODE
501 ... SILICION OXIDE FILM
601 ... GATE
602 ... ELECTRODE
701 ... INTERLAYER DIELECTRIC FILM
702 ... ALUMINUM WIRING

100 ... SUPPORTING MEMBER FOR SEMICONDUCTOR ELEMENTS
101 ... SILICATE GLASS AS BASE
102 ... SILICON OXIDE FILM AS FIRST DIELECTRIC
103 ... TUNGSTEN FILM AS CONDUCTIVE FILM
104 ... SILICION OXIDE FILM AS SECOND DIELECTRIC
201 ... POLYCRYSTAL SILICON FILM

101 ... SILICATE GLASS AS BASE
102 ... SILICON OXIDE FILM AS FIRST DIELECTRIC
103 ... TUNGSTEN FILM AS CONDUCTIVE FILM
104   SILICOIN OXIDE FILM AS SECOND DIELECTRIC
201 ... POLYCRYSTAL SILICON FILM
301 ... RESIST
302 ... MOS TRANSISTOR
303 ... RETENTION CAPACITANCE
401 ... RESIST
402 ... SOURCE/DRAIN REGION
403 ... ELECTRODE

101 ... SILICATE GLASS AS BASE
102 ... SILICON OXIDE FILM AS FIRST DIELECTRIC
103 ... TUNGSTEN FILM AS CONDUCTIVE FILM
104 SILICOIN OXIDE FILM AS SECOND DIELECTRIC
201 ... POLYCRYSTAL SILICON FILM
302 ... MOS TRANSISTOR
303 ... RETENTION CAPACITANCE
402 ... SOURCE/DRAIN REGION
403 ... ELECTRODE
501 ... SILICION OXIDE FILM
502 ... POLYCRYSTAL SILICOIN FILM
503 ... RESIST
601 ... GATE
602 ... ELECTRODE

101 ... SILICATE GLASS AS BASE
102 ... SILICON OXIDE FILM AS FIRST DIELECTRIC
103 ... TUNGSTEN FILM AS CONDUCTIVE FILM
104 SILICOIN OXIDE FILM AS SECOND DIELECTRIC
201 ... POLYCRYSTAL SILICON FILM
302 ... MOS TRANSISTOR
303 ... RETENTION CAPACITANCE
402 ... SOURCE/DRAIN REGION
403 ... ELECTRODE
501 ... SILICION OXIDE FILM
601 ... GATE
602 ... ELECTRODE
701 ... INTERLAYER DIELECTRIC FILM
702 ... ALUMINUM WIRING

SEMICONDUCTOR DEVICE AND DRIVING METHOD OF SEMICONDUCTOR DEVICE

RELATED APPLICATIONS

Japanese application No. 2004-239090 is hereby incorporated by reference in its entirety.

BACKGROUND OF THE INVENTION

1. Field of the Invention

The present invention relates to a support member for semiconductor device elements and to a method for reducing instabilities in the operation of the semiconductor device elements due to mobile ions in the support member.

2. Description of the Related Art

When mobile ions, such as sodium ions, are present in a support member that supports a semiconductor device element, operation of the semiconductor device element may become unstable if the mobile ions migrate while the semiconductor device element is being operated. The following background patent documents describe methods for alleviating the operation instability of semiconductor device elements caused by movements of mobile ions in support members. These background technologies are described with reference to the following two patent documents.

Japanese Laid-open Patent Application HEI 7-159809 proposes a technology for stably operating a semiconductor element, or device, on a support member in which, when silicate glass containing mobile ions is used as a support member base, a high density silicon nitride layer is formed on the silicate glass to prevent infiltration of mobile ions from the support member base to the semiconductor device element. Additionally, a phosphorous silica glass film is formed on the silicon nitride layer to thereby block, trap, or fix the mobile ions with the phosphorous silica glass and reduce operation instability due to mobile ions.

Further, Japanese Laid-open Patent Application HEI 5-85777 proposes a technology for stably operating a thin film transistor on a support member. A phosphorsilicate glass film is grown to block mobile ions and thereby reduce operation instability due to movement of mobile ions. Additionally, a silicon oxide film that does not contain phosphorous or boron is formed on the phosphorsilicate glass film.

However, according to the method described in Japanese Laid-open Patent Application HEI 7-159809, a silicon nitride film and a phosphorous silica glass, both of which are electrically insulating materials, are used as support members for supporting semiconductor device elements. In other words, electrically insulating films are used as supporting members in order to block the mobile ions and thereby reduce operation instability due to mobile ions traveling from the support member to the semiconductor device elements. Therefore, there is a problem in that constituent device elements of an electronic circuit that require conductive films cannot be realized using the support members of the HEI 7-159809 patent application. For example, an electric shield film cannot be formed with insulating materials, such as a silicon nitride film or a phosphorous silica glass. Therefore, additional wiring, i.e. conductive, layers are needed to provide electric shielding. The insulating, ion barrier films of the HEI 7-159809 application also make it difficult to form capacitors using capacitive coupling between semiconductor device elements.

Furthermore, because silicon nitride film and phosphorous silica glass are both transparent, i.e. translucent to light, there is a problem in that, when this technology is used for optical devices, MOS transistor regions that would likely malfunction if exposed to light cannot be blocked, or shielded, from light by these films. For this reason, a separate light blocking region, or film/layer, needs to be formed, which results in an increase in the number of manufacturing steps.

Similarly in Japanese Laid-open Patent Application HEI 5-85777, a phosphosilicate glass film and a silicon oxide film, both of which are electrically insulating materials and translucent to light, are used as the supporting member materials. This presents problems similar to those of Japanese Laid-open Patent Application HEI 7-159809.

OBJECTS OF THE INVENTION

It is an object of the present invention to provide a support member for semiconductor device elements that suppresses operation instabilities due to mobile ions in the support member.

It is another object of the present invention that the support member have conductive properties and light blocking properties.

SUMMARY OF THE INVENTION

To achieve the object described above, a support member for a semiconductor device element in accord with the present invention is characterized in comprising: a second dielectric film provided below the semiconductor device element for electrically isolating the semiconductor device element; a conductive film provided below the second dielectric film that suppresses re-distribution of positively charged mobile ions present in the second dielectric film and has at least a portion capacitively coupled to the semiconductor device element; a base provided below the conductive film and formed from a conductor or a semiconductor; and a first dielectric film formed between the base and the conductive film, that electrically insulates the base from the conductive film.

According to this structure, a conductive film is formed to be interposed between dielectric films in the support member, such that the potential on the conductive film does not need to be set to a ground potential, and re-distribution of mobile ions can be suppressed by applying a negative potential to the conductive film to thereby attract positively charged mobile ions to the conductive film.

Also, a support member for a semiconductor element in accord with the present invention is characterized in comprising: a dielectric film provided below a semiconductor device element for electrically isolating the semiconductor device element; and a conductive film provided below the dielectric film and which suppresses re-distribution of positively charged mobile ions present in the dielectric film, and has at least a portion capacitively coupled to the semiconductor device element.

According to this structure, a conductive film is formed in the supporting member, such that the conductive film can be used as an electrical shield or the like. Also, because this film has light blocking property, malfunction of the semiconductor element which may be caused by irradiated light can be prevented.

Further, a support member for a semiconductor device element in accord with the present invention is characterized in that the first dielectric film consists of glass or plastic material.

According to this structure, transparent materials can be used as the dielectric material, such that light transmissive type devices can be readily manufactured.

Also, a support member for a semiconductor device element in accord with the present invention is characterized in that the second dielectric film consists of glass or plastic material.

According to this structure, a transparent material is formed on a conductive film, such that reflective type devices which reflect light by using the conductive film can be readily manufactured.

Also, the conductive film is characterized in consisting of titanium, tungsten, molybdenum, titanium nitride, tungsten nitride or molybdenum nitride.

According to this structure, because a high-melting point metal is used, a high-temperature treatment at 800° C. or higher that may be used in a semiconductor element manufacturing process can be applied.

Also, a method for driving a support member for a semiconductor device element is characterized in that, during at least a portion of a period in which a potential is applied to at least the semiconductor device element, a potential that is lower than a lowest potential applied to the semiconductor element is applied to the conductive film.

By this driving method, mobile ions with positive charge, such as, sodium ions or the like, can be attracted to the conductive film having a lower (i.e. relatively negative) potential, such that the mobile ions can be trapped by, i.e. fixed onto, the conductive film. For this reason, operation instability due to movement of mobile ions while semiconductor elements are operating can be reduced.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
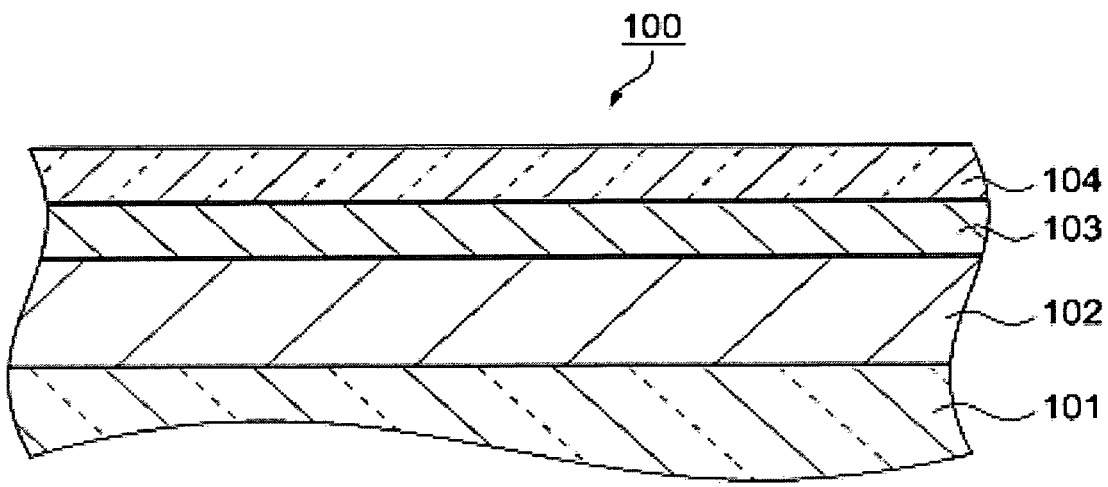
FIG. 1 is a cross-sectional view showing a supporting member for semiconductor elements.

A method for manufacturing a support member for supporting semiconductor device elements in accordance with an embodiment of the present invention is described below with reference to the accompanying drawings. FIG. 1 is a cross-sectional view showing a step in a manufacturing process for a support member 100 for semiconductor devices in accordance with the present embodiment. The support member 100 for semiconductor device elements in accordance with the present embodiment preferably supports reflective type liquid crystal semiconductor device elements, and uses a conductive film 103 (i.e. a tungsten metal film) as a light reflective plate. A method for manufacturing support member 100 along with reflective type liquid crystal device elements is described below.

FIG. 1 is a cross-sectional view in which a conductive film 103 for trapping mobile ions, such as sodium ions, is formed over a silica glass base 101. A support member 100 in accord with the present invention is formed in the following manner.

A first silicon oxide film 102, which is a first dielectric layer, is deposited on silica glass base 101 by using a CVD process (Chemical Vapor Deposition, or chemical vapor phase growth). A tungsten film 103, which is a conductive film, is then formed on oxide film 102 preferably by using a sputter method. A second silicon oxide film 104, which constitutes a second dielectric film, is then formed on tungsten film 103 preferably by a CVD process. It is noted here that first silicon oxide film 102 has a preferred film thickness of 0.4 µm, tungsten film 103 has a preferred film thickness of 200 nm, and second silicon oxide film 104 has a preferred thickness of 200 nm.

Figure 2:
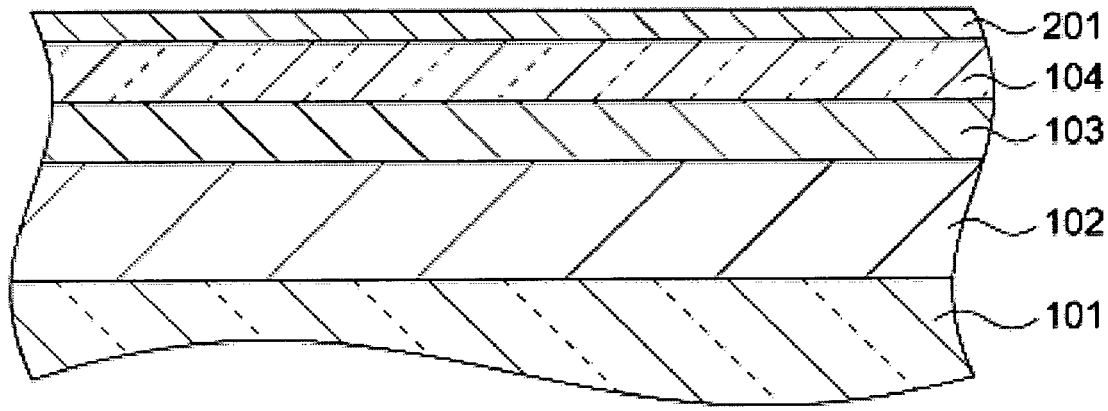
FIG. 2 is a cross-sectional view showing a step in which a polycrystal silicon film is formed on the supporting member for semiconductor elements.

FIG. 2 is a cross-sectional view showing a step in which a polycrystal silicon film 201 is formed on support member 100. The polycrystal silicon film 201 is preferably formed by forming an amorphous silicon film, and then annealing the same.

Figure 3:
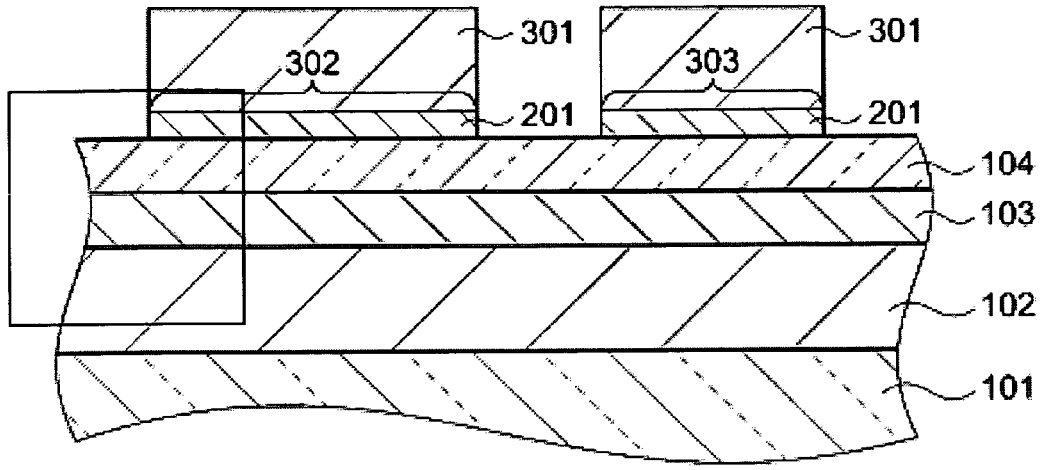
FIG. 3 is a cross-sectional view showing a step in which the polycrystal silicon film of FIG. 2 is etched.

FIG. 3 is a cross-sectional view showing a step in which the polycrystal silicon film 201 is selectively etched. To accomplish this, a resist layer 301 is first formed on polycrystal silicon film 201. The resist 301 is then patterned using photolithography to configure resist 301 into a process mask. Then, using resist 301 as a mask, the polycrystal silicon film 201 is etched to define areas where a transistor 302 (see FIG. 7) and a retention capacitor 303 (see FIG. 7) are to be constructed.

Figure 4:
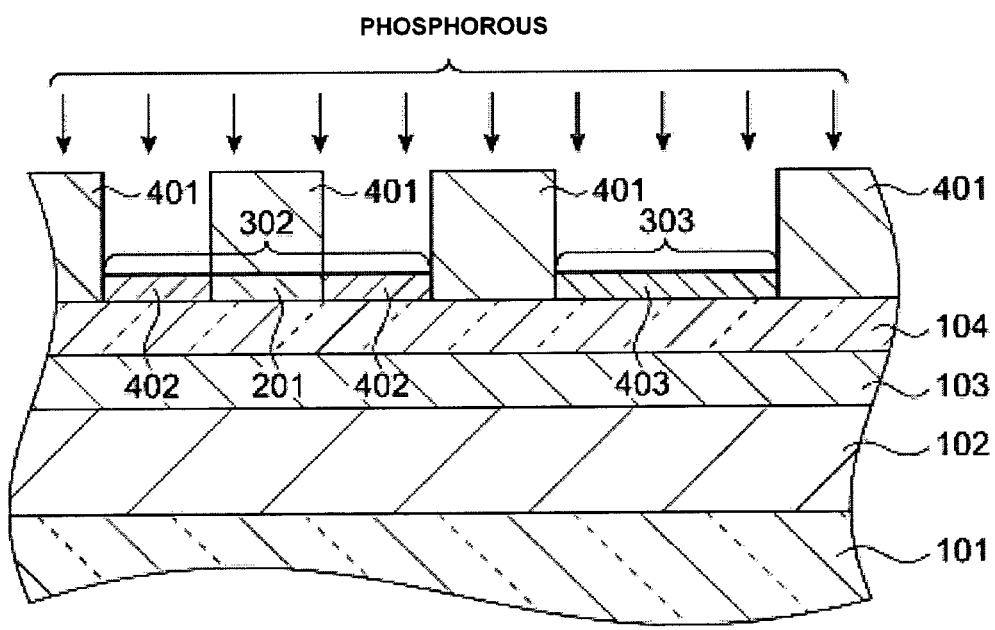
FIG. 4 is a cross-sectional view showing a state in which ion injection is conducted with the use of a resist as a mask.

As shown in FIG. 4, after removing resist mask 301 by ashing, a first plate of what will be retention capacitor 303 and source/drain regions 402 of what will be MOS transistor 302 are formed. Specifically, using as a mask a resist layer 401, which has been patterned using a photolithography process, phosphorous ions are injected in exposed portions of polycrystal silicon film 201 to from source/drain regions 402 of MOS transistor 302 and to form a conductive plate of retention capacitor 303.

Figure 5:
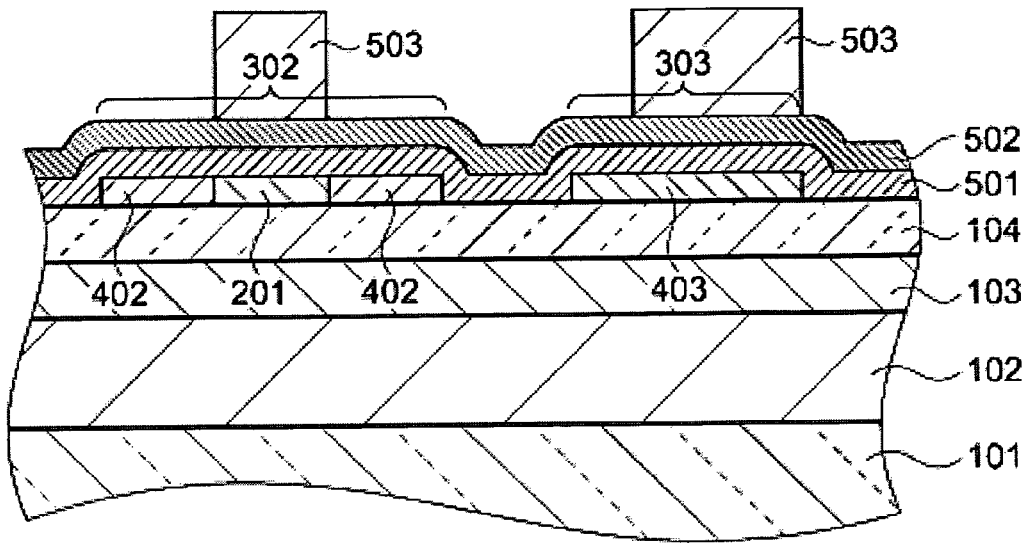
FIG. 5 is a cross-sectional view showing a state in which an MOS transistor and a capacitor region are formed.

FIG. 5 is a cross-sectional view showing another process step in the construction of the MOS transistor and the retention capacitor. The resist layer 401 of FIG. 4 is removed by ashing, and then a silicon oxide film 501 is formed. Silicon oxide film 501 is later patterned to form a gate oxide for MOS transistor 302 and to form an inter-plate dielectric film for the capacitor 303. A polycrystal silicon film 502 is then formed on silicon oxide film 501. Polycrystal silicon 502 is later patterned to form a control gate electrode over the gate oxide of MOS transistor 302, and to form a second conductive plate over the dielectric film of retention capacitor 303. Then, a resist mask 503 is formed on polycrystal silicon film 502 by patterning using photolithography. It is noted that the polycrystal silicon film 502 is preferably formed by forming an amorphous silicon film containing phosphorous, and annealing the same.

Figure 6:
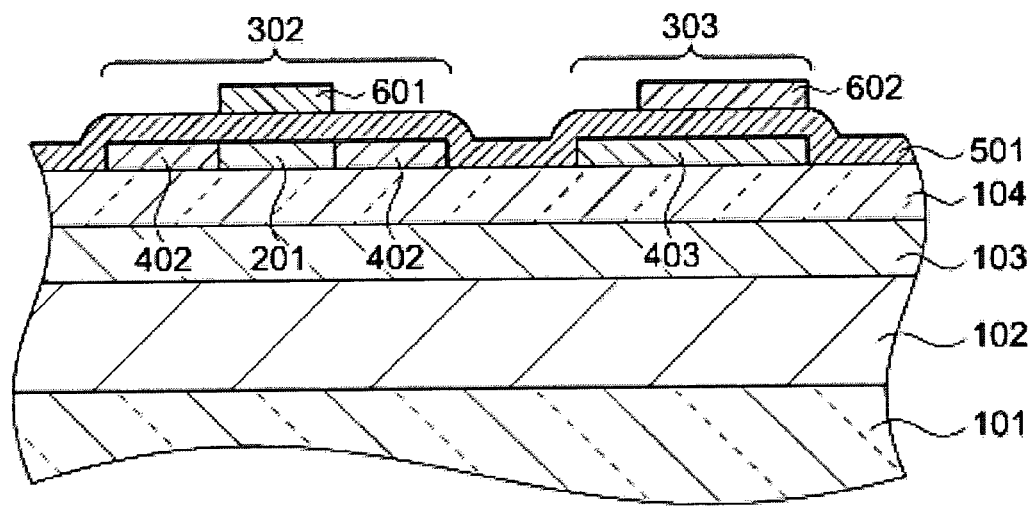
FIG. 6 is a cross-sectional view showing a step at the time when ashing is finished.

FIG. 6 is a cross-sectional view showing a step following an ashing step to remove resist mask 503. Using resist 503 as a mask, polycrystal silicon film 502 was etched, and after the etching was complete, the resist mask 503 was removed by ashing. At this point, a control gate 601 of MOS transistor 302 and a plate electrode 602 of retention capacitor 303 are formed.

Figure 7:
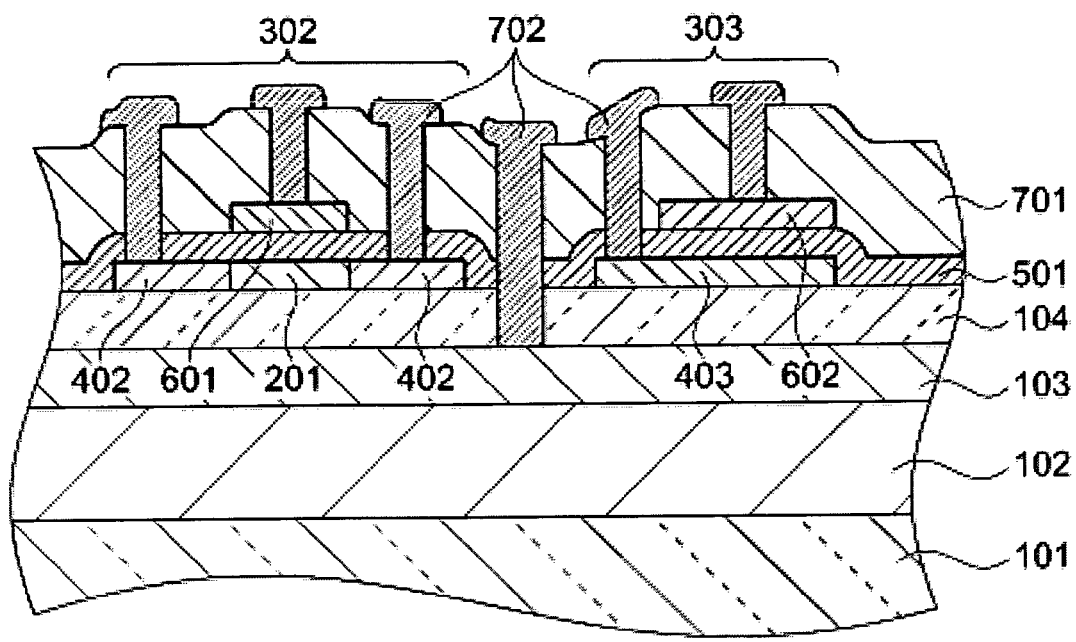
FIG. 7 is a cross-sectional view showing a step when metal wiring layers are formed.

FIG. 7 is a cross-sectional view showing the construction of metal wiring layers. An interlayer dielectric film 701 composed of a silicon oxide film is formed by a CVD process, contact holes are then opened in specified portions of interlayer dielectric film 701 by photolithography. Following this, an aluminum film preferably containing silicon and copper added therein is formed by a sputtering, a resist mask is then formed by photolithography, and selected regions of the aluminum film is removed as defined by the resist mask. This leaves specific areas of aluminum film, which form aluminum wiring 702. The the resist mask is preferably removed by ashing.

Next, a method for driving the support member 100 with semiconductor device elements formed thereon is described with reference to FIG. 7. In FIG. 7, when the lowest potential that is applied to semiconductor device elements formed on support member 100 (such as MOS transistor 302 and retention capacitance 303) is 0V, a potential of −3V is applied to tungsten film 103, which is a constituent element of support member 100, for driving the same.

Because a voltage that is lower than the lowest potential of 0V applied to the semiconductor device elements is applied to tungsten film 103, alkaline metal ions (such as sodium ions, that are mobile and positively charged and present in silica glass base 101 and silicon oxide films 102 and 104) migrate to tungsten film 103 (which is maintained at a lower potential of −3V) and are trapped and fixed by the tungsten film 103.

Because a method of drawing (i.e. attracting) and holding fixed (i.e. trapping) mobile ions by means of an electric field is used, mobile ions that are present not only adjacent to the tungsten film 103 that is used for trapping the mobile ions, but also mobile ions within a range in which electric lines of force of the tungsten film 103 reach can be attracted and trapped by the tungsten film 103. Therefore, operation of the semiconductor device elements can be made more stabile as compared to the prior art case using an insulating barrier to block the penetration of mobile ions and keep them fixed to a phosphorsilicate glass.

Also, the tungsten film 103 is conductive. For this reason, a capacitance region can be formed with the electrode 403 laminated through the silicon oxide film 104 deposited on the tungsten film 103. In addition to the retention capacitor formed with the electrode 403, the silicon oxide film 501 and the electrode 602, a capacitor is also formed with electrode 403, silicon oxide film 104 and tungsten film 103, such that a greater retention capacitance value can be formed within a smaller area. In the case of the presently preferred embodiment where the silicon oxide film 104 is 200 nm in thickness and the silicon oxide film 501 is 100 nm in thickness, an area necessary for obtaining an equivalent capacitance can be achieved with about 70% less area than is needed in the case where the tungsten film 103 is not present, such that the area necessary for construction a retention capacitor can be reduced.

Also, in accord with the present embodiment, MOS transistor 302 and other semiconductor device elements on the support member 100 are electrically shielded. For this reason, even when electric noise infiltrates due to certain factors, malfunctions of MOS transistor 302 can be effectively suppressed by the shielding effect of the tungsten film 103.

Also, the tungsten film 103 is a light blocking material. Accordingly, when the tungsten film 103 is present under MOS transistor 302, light infiltrating from the back surface of support member 100 is blocked, such that malfunctions of MOS transistor 302 caused by light, in particular, an increase in the off current accompanied with generation of carriers in the semiconductor due to light irradiation, can be prevented.

Effects of the embodiments are described below.

(1) Because the tungsten film 103, which is a metal film having light blocking properties is used, areas of semiconductor device elements (including transistors) are shielded from light. For this reason, a leakage current due to carriers caused by light, which poses a problem especially in an OFF state, can be suppressed.

(2) Because the silicon oxide film 102 having few mobile ions is formed by a CVD method as a buffer layer on the silica glass base 101 that contains many mobile ions such as sodium ions, operations of the semiconductor device elements can be further stabilized.

(3) Because the transparent dielectric layer 104 is formed on the tungsten film 103, which is a metal of a high light-reflecting ability, a reflective type device can be readily formed.

(4) Because the tungsten film 103, which is an electrical conductor, is used for attracting and trapping mobile ions, a function of a capacitive element (such as a capacitor) and a shielding function can be obtained in addition to a gettering function for mobile ions.

(5) Because mobile ions are attracted and fixed by applying a negative potential to the tungsten film 103, the mobile ions can be trapped within a range defined by the reach of electric lines of force, such that mobile ions in a greater range can be attracted and trapped, as compared to the case where a phosphosilicate glass is used for blocking infiltration (i.e. migration) by mobile ions.

MODIFIED EXAMPLE 1

Instead of using the silicate glass base 101 as a base in the present embodiment, and forming the silicon oxide film 102 thereon by a CVD method, a metal or semiconductor material may be used as a base. In particular, by using a base having a SOI (Silicon On Insulator: silicon (normally in single crystal) on a dielectric) structure, electrically excellent device characteristics can be obtained.

MODIFIED EXAMPLE 2

Instead of forming the silicon oxide film 102 as a first dielectric on the silica glass base 101 in the present embodiment, a tungsten film 103 (which is a metal film) may be formed without forming the silicon oxide film 102. When the base is dielectric, the first dielectric film can be omitted.

MODIFIED EXAMPLE 3

Instead of forming a reflective type liquid crystal device by leaving the tungsten film 103 as a light reflecting film, the present embodiment can be applied to, for example, a light transmissive type liquid crystal device. Specifically, this can be realized by forming a tungsten film 103, and immediately thereafter, etching the tungsten film 103 in portions where liquid crystal elements are to be formed. In this instance, by etching the tungsten film 103 while leaving portions thereof where the MOS transistor 302 and the retention capacitor 303 are present, mobile ions can be fixed, the capacitance of the retention capacitor 303 can be increased, and effects of light blocking mask can be obtained.

MODIFIED EXAMPLE 4

Instead of using the tungsten film 103 as a light reflecting film for fixing mobile ions in the present embodiment, or without limiting the subject matter to the application of tungsten for use as a light reflecting film, other metals, such as, for example, an aluminum film laminated in an upper layer can be used as a light reflecting film.

MODIFIED EXAMPLE 5

Instead of using the silicate glass base 101 as a base in accordance with the present embodiment, for example, a plastic material base can also be used. In this case, although the tungsten film 103 can be used for fixing mobile ions without a problem, a much softer metal such as aluminum may preferably be used. Also, when a plastic material substrate is used, it may be difficult to perform a high temperature treatment at 800° C. or higher. Accordingly, instead of using the polycrystal silicon film 201 as a semiconductor film, amorphous silicon may be used as a semiconductor film.

To recap one operation of the present invention, when the lowest operating potential that is applied to semiconductor device elements (such as transistor 302 and capacitor 303) on the support member 100 is 0V, a protective potential of −3V may be applied to the tungsten film 103, which is a constituent element of support member 100. Because the protective voltage applied to the tungsten film 103 is lower than the lowest operating potential of 0V applied to the semiconductor device elements, mobile and positively charged alkaline metal ions, such as sodium ions, present in the silica glass base 101 and in silicon oxide films 102 and 104 migrate to the tungsten film 103 due to the attractive force of the maintained lower potential, and are thereby trapped by and fixed to the tungsten film 103.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device, comprising:
a substrate;
a conductive material over the substrate;
a first dielectric material on the conductive material; and
a circuit element on the first dielectric material;
a potential of the conductive material having a level lower than any potential applied to the circuit element.

2. The semiconductor device of claim 1, further comprising;
a second dielectric material disposed between the substrate and the conductive material.

3. The semiconductor device of claim 1, wherein;
the conductive material constitutes a wiring layer; and
at least a portion of said wiring layer is coupled to an electrode of the circuit element.

4. The semiconductor device of claim 1, wherein;
the first dielectric material includes glass or plastic material.

5. The semiconductor device of claim 1, wherein:
the substrate includes glass, plastic, or electric conductor material.

6. The semiconductor device of claim 1, wherein:
the conductive material shades the circuit element.

7. A semiconductor device, comprising:
a substrate;
a conductive material over the substrate;
a dielectric material on the conductive material; and
a circuit element on the dielectric material;
a potential of the conductive material having a level lower than any potential applicable to the circuit element.

8. A semiconductor device, comprising:
a substrate;
a conductive material on the substrate;
a dielectric material on the conductive material; and
a circuit element on the dielectric material;
a potential being applied to the conductive material, the potential having a level lower than any of potential applied to the circuit element.

9. The semiconductor device of claim 1, wherein the circuit element includes a transistor.

10. The semiconductor device of claim 2, wherein the circuit element includes a transistor.

11. The semiconductor device of claim 3, wherein the circuit element includes a transistor.

12. The semiconductor device of claim 4, wherein the circuit element includes a transistor.

13. The semiconductor device of claim 5, wherein the circuit element includes a transistor.

14. The semiconductor device of claim 6, wherein the circuit element includes a transistor.

15. The semiconductor device of claim 7, wherein the circuit element includes a transistor.

16. The semiconductor device of claim 8, wherein the circuit element includes a transistor.

17. The semiconductor device of claim 9, wherein the transistor is an MOS transistor.

18. The semiconductor device of claim 15, wherein the transistor is an MOS transistor.

19. The semiconductor device of claim 16, wherein the transistor is an MOS transistor.

20. An apparatus having a semiconductor device, said apparatus comprising:
a substrate;
a conductive material over the substrate; and
a dielectric material on the conductive material;
wherein the semiconductor device is on the dielectric material, and a potential of the conductive material is lower than any potential applied to the semiconductor device.

21. An apparatus having a semiconductor device, said apparatus comprising:
a substrate;
a conductive material over the substrate; and
a dielectric material on the conductive material;
wherein the semiconductor device is on the dielectric material, and a potential of the conductive material is lower than any potential applicable to the semiconductor device.

22. An apparatus having a semiconductor device, said apparatus comprising:
a substrate;
a conductive material over the substrate; and
a dielectric material on the conductive material;
wherein the semiconductor device is on the dielectric material, and a potential is applied to the conductive material, said potential having a level lower than any potential applied to the semiconductor device.

23. The apparatus of claim 20, wherein the semiconductor device includes a transistor.

24. The apparatus of claim 21, wherein the semiconductor device includes a transistor.

25. The apparatus of claim 22, wherein the semiconductor device includes a transistor.

26. The apparatus of claim 23, wherein the transistor is an MOS transistor.

27. The apparatus of claim 24, wherein the transistor is an MOS transistor.

28. The apparatus of claim 25, wherein the transistor is an MOS transistor.

* * * * *